(12) United States Patent
Komori

(10) Patent No.: US 7,948,761 B2
(45) Date of Patent: May 24, 2011

(54) DISPLAY DEVICE

(75) Inventor: Fumiaki Komori, Isumi (JP)

(73) Assignee: Hitachi Displays, Ltd., Chiba (JP)

( * ) Notice: Subject to any disclaimer, the term of this patent is extended or adjusted under 35 U.S.C. 154(b) by 831 days.

(21) Appl. No.: 11/865,744

(22) Filed: Oct. 2, 2007

(65) Prior Publication Data

US 2008/0130210 A1    Jun. 5, 2008

(30) Foreign Application Priority Data

Oct. 3, 2006    (JP) ................................ 2006-271552

(51) Int. Cl.
*H05K 1/00* (2006.01)
(52) U.S. Cl. ........... 361/749; 174/254; 439/632; 439/55
(58) Field of Classification Search .................. 361/749; 439/632; 174/254
See application file for complete search history.

(56) References Cited

U.S. PATENT DOCUMENTS

| | | | | |
|---|---|---|---|---|
| 4,335,272 A | * | 6/1982 | Pittenger | 174/254 |
| 5,397,239 A | * | 3/1995 | Zaderej et al. | 439/55 |
| 5,892,747 A | * | 4/1999 | Okada et al. | 720/647 |
| 6,842,585 B2 | * | 1/2005 | Matsuo et al. | 396/89 |
| 7,212,413 B2 | * | 5/2007 | Chang et al. | 361/749 |
| 7,350,326 B2 | * | 4/2008 | Hu | 40/544 |
| 2002/0051345 A1 | * | 5/2002 | Serizawa et al. | 361/749 |
| 2005/0007354 A1 | | 1/2005 | Yamada | |
| 2005/0202694 A1 | * | 9/2005 | Yumoto et al. | 439/67 |
| 2006/0097364 A1 | * | 5/2006 | Shinojima | 257/666 |
| 2006/0125981 A1 | * | 6/2006 | Okuda | 349/110 |

* cited by examiner

*Primary Examiner* — Hung S Bui
*Assistant Examiner* — Steven Sawyer
(74) *Attorney, Agent, or Firm* — Antonelli, Terry, Stout & Kraus, LLP.

(57) ABSTRACT

The present invention provides a technique which can decrease the number of folding times of a flexible printed circuit board in a display device having the structure which can fold the flexible printed circuit board in a compact form by folding the flexible printed circuit board plural times. The display device includes a display panel having substrates, and a flexible printed circuit board having one end thereof fixed to a peripheral portion of a first side of the substrate, wherein the flexible printed circuit board forms an I/F portion on which a plurality of input terminals is formed in the inside thereof in a state that the flexible printed circuit board is developed.

6 Claims, 6 Drawing Sheets

DISPLAY DEVICE

CROSS-REFERENCE TO RELATED APPLICATIONS

The disclosure of Japanese Patent Application No. 2006-271552 filed on 2006 Oct. 2003 (yyyy/mm/dd) including the claims, the specification, the drawings and the abstract is incorporated herein by reference in its entirety.

BACKGROUND

1. Field of the Invention

The present invention relates to a display device, and more particularly to a technique which is effectively applicable to a display device including a flexible printed circuit board.

2. Description of Related Art

A TFT (Thin Film Transistor) liquid crystal display module has been popularly used as a display device of a note-type personal computer, a car navigation system or the like.

FIG. 7 is a view for explaining the conventional constitution of a TFT liquid crystal module mounted in a car as the car navigation system.

In FIG. 7, symbol LCD indicates a liquid crystal display panel, symbol DRV indicates video line drive circuits (also referred to as drain drivers or source drivers), symbol GRV indicates scanning line drive circuits (also referred to as gate drivers), symbol FPC indicates a flexible printed circuit board, and symbol IFT indicates an I/F portion. The I/F portion (IFT) of the flexible printed circuit board (FPC) is a portion provided for connecting the flexible printed circuit board and a printed circuit board on which the driver circuits is mounted which is arranged on a back surface of the liquid crystal display panel (LCD), and a plurality of input terminals is formed on the I/F portion (IFT). The input terminals are electrically and mechanically connected with connectors mounted on the printed circuit board on which the driver circuits is mounted.

In the liquid crystal display module shown in FIG. 7, display data, control signals and power source voltages are inputted to the respective video line drive circuits (DRV) and the respective scanning line drive circuits (GRV) via the flexible printed circuit board (FPC). Accordingly, the number of lines formed on the flexible printed circuit board (FPC) is increased and hence, a profile size of the flexible printed circuit board (FPC) inevitably becomes large.

Further, the flexible printed circuit board (FPC) has one end thereof fixed to a peripheral portion of longitudinal one side of a glass substrate and has remaining ends thereof arranged on a back side of the backlight by folding. In such a state, when a profile size of the flexible printed circuit board (FPC) is larger than a profile size of the liquid crystal display panel (LCD), the flexible printed circuit board (FPC) projects outwardly from the liquid crystal display panel (LCD).

In such a case, it is necessary to fold the flexible printed circuit board (FPC) plural times so as to retain the flexible printed circuit board (FPC) within the profile size of the liquid crystal display panel (LCD).

SUMMARY

In a state that the flexible printed circuit board (FPC) is arranged on the back side of the backlight by folding, when the profile size of the flexible printed circuit board (FPC) is larger than the profile size of the liquid crystal display panel (LCD), to retain the flexible printed circuit board (FPC) within the profile size of the liquid crystal display panel (LCD), as shown in FIG. 8 and FIG. 9, it is necessary to adopt the structure which can fold the flexible printed circuit board (FPC) in a compact form by folding the flexible printed circuit board (FPC) plural times.

That is, as shown in FIG. 10A and FIG. 10B, as a first step, the flexible printed circuit board (FPC) is folded back to the back side of the backlight (BLT). Next, as a second step, a portion of the flexible printed circuit board (FPC) which is folded back to the back side of the backlight (BLT) is folded back to the outside along an imaginary folding line (ORS). Finally, the I/F portion (IFT) is folded back to the outside along the imaginary folding line (ORS).

Here, FIG. 8 is a cross-sectional view for explaining the structure which can fold the flexible printed circuit board (FPC) in a compact form by folding the flexible printed circuit board (FPC) plural times in the conventional liquid crystal display module, FIG. 9 is a back view for explaining the structure which can fold the flexible printed circuit board (FPC) in a compact form by folding the flexible printed circuit board (FPC) plural times in the conventional liquid crystal display module, and FIG. 10 is a perspective view for explaining the structure which can fold the flexible printed circuit board (FPC) in a compact form by folding the flexible printed circuit board (FPC) plural times in the conventional liquid crystal display module. Further, in FIG. 8, FIG. 9 and FIG. 10, symbol BLT indicates a backlight, symbol DCB indicates a printed circuit board on which the driver circuits is mounted, symbol CNT indicates connectors, symbol IFT indicates an I/F portion, symbol ITA indicates input terminals and symbol ORS indicates an imaginary folding line.

The reason that the flexible printed circuit board (FPC) is retained in a folded manner is as follows. Not to mention that the flexible printed circuit board (FPC) is required to satisfy the profile size of the liquid crystal display panel (LCD), it is also necessary for the flexible printed circuit board (FPC) to adjust a connecting position between the connectors (CNT) and the input terminals (ITA) for connecting the connectors (CNT) formed on the printed circuit board on which the driver circuits is mounted (DCB) which is arranged on the back surface of the liquid crystal display panel (LCD) and the input terminals (ITA) formed on the flexible printed circuit board (FPC) with each other.

However, the conventional liquid crystal display module having the structure which can fold the flexible printed circuit board (FPC) in a compact form by folding the flexible printed circuit board (FPC) plural times has the following drawbacks.

(1) Along with the increase in the number of folding steps of the flexible printed circuit board, an operation time is increased.

(2) Along with the increase in the number of folding times of the flexible printed circuit board, a thickness of the product is increased.

The present invention has been made to overcome the above-mentioned drawbacks in the conventional technique and it is an object of the present invention to decrease the number of folding times of the flexible printed circuit board in a display device having the structure which can fold the flexible printed circuit board in a compact form by folding the flexible printed circuit board plural times.

The above-mentioned and other objects and novel features of the present invention will become apparent based on the description of this specification and attached drawings.

The following is a brief explanation of the summary of typical inventions among the inventions disclosed in this specification.

(1) The present invention is directed to a display device (for example, a liquid crystal display device) which includes a display panel having substrates, and a flexible printed circuit board having one end thereof fixed to a peripheral portion of a first side of the substrate, wherein the flexible printed circuit board includes an I/F portion on which a plurality of input terminals is formed, and the I/F portion is, in a state that the flexible printed circuit board is developed, formed in the inside of the flexible printed circuit board.

(2) In the display device having the constitution (1), the flexible printed circuit board forms slits therein along three sides of a predetermined first rectangular shape, and the I/F portion is constituted of a portion which has one side thereof connected to the flexible printed circuit board and has remaining three other sides thereof cut out from the flexible printed circuit board by the slits formed in the flexible printed circuit board along three sides of the first rectangular shape.

(3) In the display device having the constitution (2), the flexible printed circuit board is folded back to a back side of the display panel, out of a portion of the flexible printed circuit board which is folded back to the back side of the display panel, assuming a part of the portion which includes a distal end portion of the flexible printed circuit board as a first region and assuming a remaining part of the flexible printed circuit board as a second region with an arbitrary imaginary folding line sandwiched therebetween, the portion of the flexible printed circuit board which is folded back to the back side of the display panel is folded back along the arbitrary imaginary folding line such that the first region overlaps the second region, and the I/F portion projects outwardly from the imaginary folding line in a state that the portion of the flexible printed circuit board which is folded back to the back side of the display panel is folded back along the imaginary folding line.

(4) In the display device having the constitution (3), the I/F portion is connected to the flexible printed circuit board in the first region.

(5) In the display device having the constitution (3), the I/F portion is connected to the flexible printed circuit board in the second region.

(6) In the display device having the constitutions (3) to (5), the flexible printed circuit board forms a guide groove therein along the arbitrary imaginary folding line.

(7) In the display device having the constitutions (3) to (6), the display device includes a means for temporarily fixing the first region to the second region in a state that the portion of the flexible printed circuit board which is folded back to the back side of the display panel is folded back along the arbitrary imaginary folding line such that the first region overlaps the second region.

(8) In the display device having the constitution (7), the means for temporarily fixing the first region to the second region is constituted of a projection formed on the first region and a cutout portion formed in the second region, and the first region is temporarily fixed to the second region by inserting the projection into the cutout portion in a state that the portion of the flexible printed circuit board which is folded back to the back side of the display panel is folded back along the arbitrary imaginary folding line.

(9) In the display device having the constitution (8), the first region of the flexible printed circuit board forms slits therein along three sides of a predetermined second rectangular shape, and the projection is constituted of a portion which has one side thereof connected to the flexible printed circuit board and has remaining three other sides thereof cut out from the flexible printed circuit board by the slits formed in the flexible printed circuit board along three sides of the second rectangular shape.

According to the typical inventions among the inventions disclosed in this application, it is possible to decrease the number of folding times of the flexible printed circuit board in the display device having the structure which can fold the flexible printed circuit board in a compact form by folding the flexible printed circuit board plural times.

DETAILED DESCRIPTION OF THE INVENTION

Hereinafter, an embodiment of the present invention is explained in detail in conjunction with drawings.

Here, in all drawings for explaining the embodiments, parts having identical functions are given same symbols and their repeated explanation is omitted.

Figure 1:
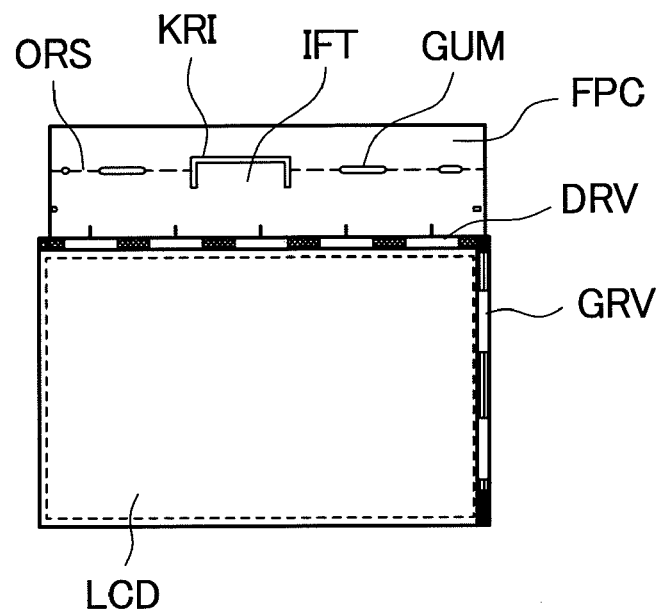
FIG. 1 is a view for explaining a liquid crystal display module of an embodiment according to the present invention.

FIG. 1 is a view for explaining a liquid crystal module of an embodiment according to the present invention. In FIG. 1, symbol LCD indicates a liquid crystal display panel, symbol DRV indicates video line drive circuits (also referred to as drain drivers or source drivers), symbol GRV indicates scanning line drive circuits (also referred to as gate drivers), symbol FPC indicates a flexible printed circuit board, symbol IFT indicates an I/F portion, symbol KRI indicates a U-shaped slit which is formed in a periphery of the I/F portion (IFT), symbol ORS indicates an imaginary folding line, and symbol GUM indicates guide grooves which are formed along the imaginary folding line (ORS). Here, in FIG. 1 and FIG. 3 to FIG. 5 with which the embodiment will be explained later, input terminals (ITA) which are formed on the I/F portion (IFT) are omitted.

The liquid crystal display panel (LCD) is, for example, configured such that a first glass substrate (also referred to as a TFT substrate) on which pixel electrodes, thin film transistors (TFT) and the like are formed and a second glass substrate (also referred to as a filter substrate) on which counter electrodes, color filters and the like are formed overlap each other with a predetermined distance therebetween. Further, both glass substrates are adhered to each other by a frame-shaped sealing material which is formed in the vicinity of peripheral portions of both glass substrates. Liquid crystal is sealed into a space defined inside the sealing material between both glass substrates through a liquid crystal filling port which is formed in a portion of the sealing material. Further, a polarizer is adhered to outer sides of both glass substrates. Here, the present invention is not directly relevant to the internal structure of the liquid crystal panel and hence, a detailed explanation of the internal structure of the liquid crystal panel is omitted. Further, the present invention is applicable to a liquid crystal panel having any kind of structure.

In this embodiment, the flexible printed circuit board (FPC) has one end thereof fixed to a peripheral portion of a longitudinal side of the first glass substrate which constitutes the liquid crystal display panel (LCD) and has remaining ends thereof arranged on a back side of the liquid crystal display panel (LCD) by folding.

As shown in FIG. 1, this embodiment is characterized in that, in a state that the flexible printed circuit board (FPC) is developed, the I/F portion (IFT) which is provided for connecting the flexible printed circuit board (FPC) and a printed circuit board on which the driver circuits is mounted (DCB) which is arranged on a back surface of the liquid crystal display panel (LCD) is formed in the inside (a portion other than an outer periphery) of the flexible printed circuit board (FPC).

That is, the flexible printed circuit board (FPC) includes a slit (KRI) which is formed along three sides of a predetermined first rectangular shape, the I/F portion (IFT) is constituted of a portion which has one side thereof connected to the flexible printed circuit board (FPC) and has remaining three other sides thereof cut out from the flexible printed circuit board (FPC) by the slit (KRI) formed in the flexible printed circuit board (FPC) along three sides of the first rectangular shape.

Further, in the flexible printed circuit board (FPC), to facilitate the folding of the flexible printed circuit board (FPC), guide grooves (GUM) are formed along the imaginary folding line (ORS).

Figure 2:
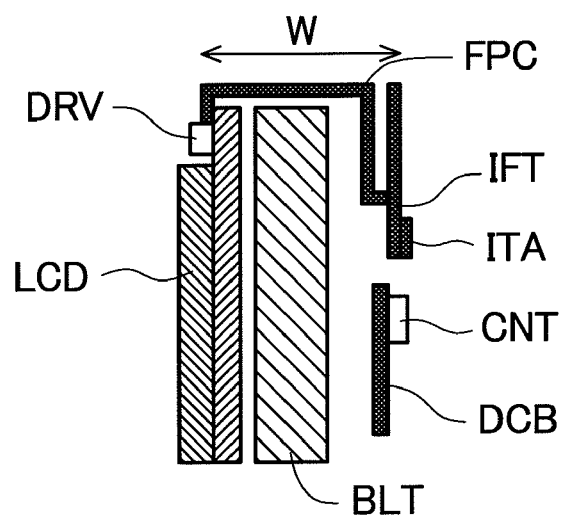
FIG. 2 is a cross-sectional view for explaining the structure which can fold a flexible printed circuit board in a compact form by folding the flexible printed circuit board plural times in the liquid crystal display module of the embodiment of the present invention.

FIG. 2 is a cross-sectional view for explaining the structure which can fold the flexible printed circuit board (FPC) in a compact form by folding the flexible printed circuit board (FPC) plural times in the liquid crystal display module of this embodiment, and FIG. 3 is a perspective view for explaining the structure which can fold the flexible printed circuit board (FPC) in a compact form by folding the flexible printed circuit board (FPC) plural times in the liquid crystal display module of this embodiment. Further, in FIG. 2, symbol DRV indicates video line drive circuits, symbol BLT indicates a backlight, symbol DCB indicates a printed circuit board on which the driver circuits is mounted, symbol CNT indicates connectors, and symbol ITA indicates input terminals formed on the I/F portion (IFT).

Figure 3A:
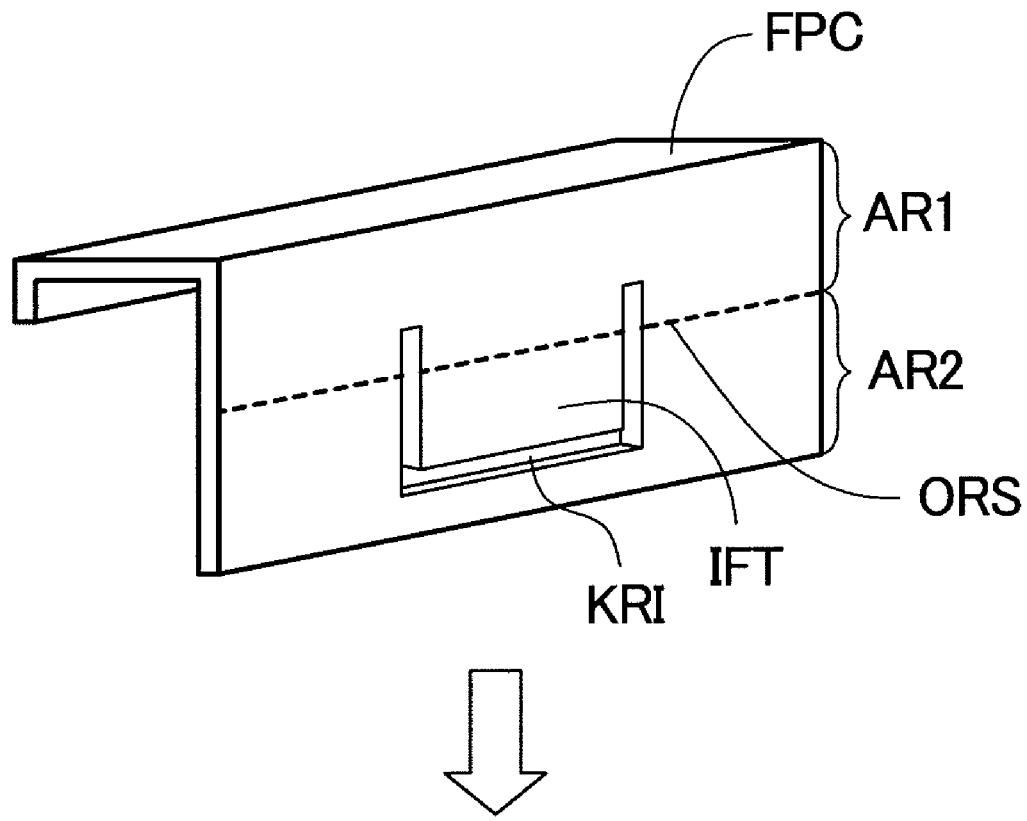
FIG. 3 is a perspective view for explaining the structure which can fold the flexible printed circuit board in a compact form by folding the flexible printed circuit board plural times in the liquid crystal display module of the embodiment of the present invention.

Also this embodiment adopts the structure which can fold the flexible printed circuit board (FPC) in a compact form by folding the flexible printed circuit board (FPC) plural times. That is, as shown in FIG. 2 and FIG. 3A, in this embodiment, as a first step, the flexible printed circuit board (FPC) is folded back to the back side of the liquid crystal display panel (LCD), and more particularly to the back side of the backlight (BLT).

Next, as a second step, out of a portion of the flexible printed circuit board (FPC) which is folded back to the back side of the backlight (BLT), assuming a part of the portion which includes a distal end portion of the flexible printed circuit board (FPC) as a first region (a region indicated by symbol AR1 in FIG. 3A) and assuming a remaining part of the flexible printed circuit board (FPC) as a second region (a region indicated by symbol AR2 in FIG. 3A) with an imaginary folding line (ORS) sandwiched therebetween, in this embodiment, the portion of the flexible printed circuit board (FPC) which is folded back to the back side of the backlight (BLT) is folded along the imaginary folding line (ORS) such that the first region overlaps the second region.

Figure 3B:
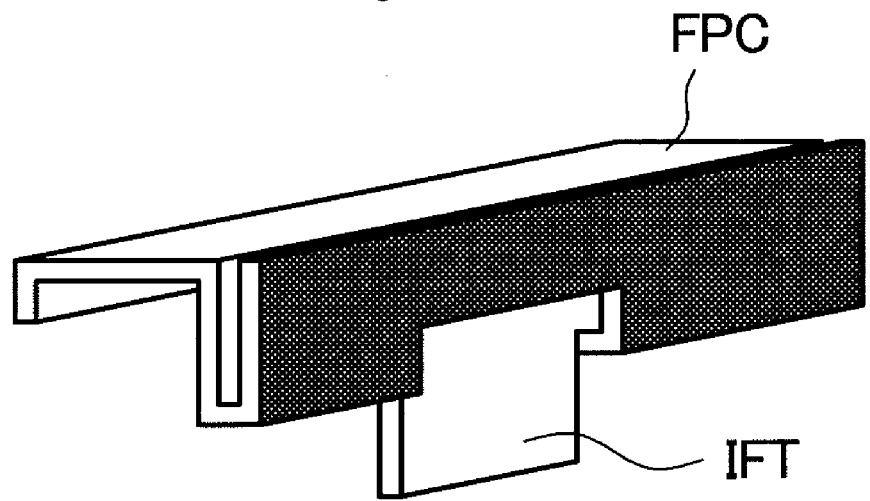

In this embodiment, when the portion of the flexible printed circuit board (FPC) which is folded back to the back side of the backlight (BLT) is folded along the imaginary folding line (ORS) such that the first region overlaps the second region, as shown in FIG. 3B, the I/F portion (IFT) projects outwardly from the imaginary folding line (ORS). Accordingly, in such a state, the I/F portion (IFT) of the flexible printed circuit board (FPC) and the connector (CNT) formed on a printed circuit board on which a driver circuits is mounted (DCB) can be electrically and mechanically connected with each other.

Here, on the printed circuit board on which the driver circuits is mounted (DCB), for example, a timing controller, a power source circuit and the like are mounted. The timing controller is, for example, constituted of one semiconductor integrated circuit (LSI). The timing controller controls and drives the respective video line drive circuits (DRV) and the respective scanning line drive circuits (GRV) based on respective display control signals such as a clock signal, a display timing signal, a horizontal synchronizing signal and a vertical synchronizing signal, and display data (R, G, B) which are transmitted from a computer body side.

Figure 4:
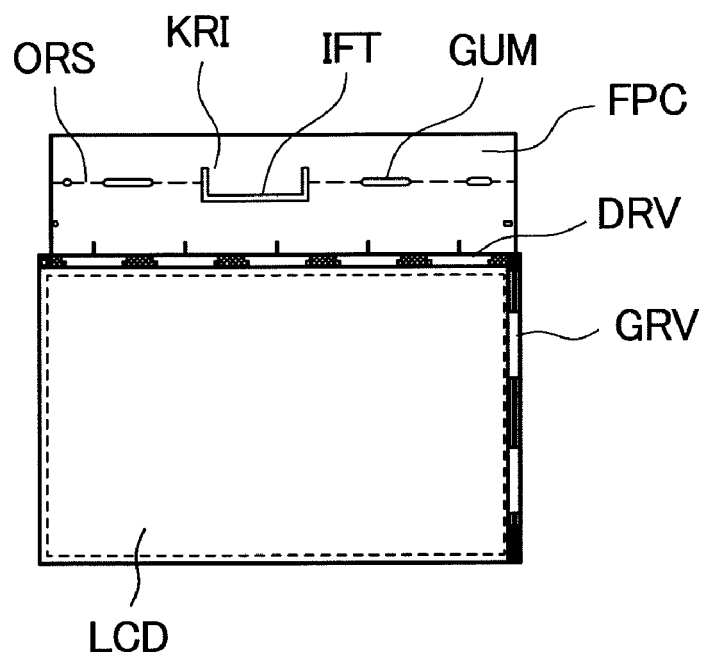
FIG. 4 is a view for explaining a modification of the liquid crystal display module of the embodiment of the present invention.

FIG. 4 is a view for explaining a modification of the liquid crystal display module of the embodiment according to the present invention.

In the embodiment shown in FIG. 1, in a state that the flexible printed circuit board (FPC) is developed, the I/F portion (IFT) is connected to the flexible printed circuit board (FPC) in the second region (the region indicated by symbol AR2 in FIG. 3A). However, in the modification shown in FIG. 4, the I/F portion (IFT) is connected to the flexible printed circuit board (FPC) in the first region (the region indicated by symbol AR1 in FIG. 3A). Although the modification shown in FIG. 4 differs from the embodiment shown in FIG. 1 in this point, the embodiment and the modification are equal with respect to other constitutions.

Also in the modification shown in FIG. 4, when the portion of the flexible printed circuit board (FPC) which is folded back to the back side of the backlight (BLT) is folded along the imaginary folding line (ORS) such that the first region overlaps the second region, the I/F portion (IFT) projects outwardly from the imaginary folding line (ORS). Accordingly, in such a state, the I/F portion (IFT) of the flexible printed circuit board (FPC) and the connector (CNT) formed on the printed circuit board on which the driver circuits is mounted (DCB) can be electrically and mechanically connected to each other.

Figure 5:
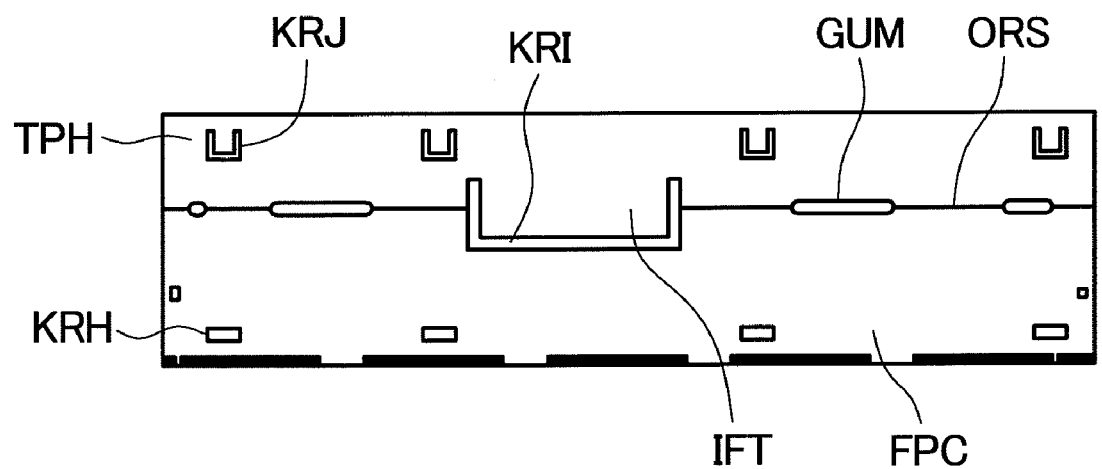
FIG. 5 is a view for explaining a modification of the flexible printed circuit board of the embodiment of the present invention.

FIG. 5 is a view for explaining another modification of the flexible printed circuit board (FPC) of the embodiment of the present invention.

The modification shown in FIG. 5 differs from the embodiment shown in FIG. 1 with respect to a point that, in a state that the portion of the flexible printed circuit board (FPC) which is folded back to the back side of the backlight (BLT) is folded along the imaginary folding line (ORS) such that the first region (the region indicated by symbol AR1 in FIG. 3A) overlaps the second region (the region indicated by symbol AR2 in FIG. 3A), the modification further includes a means for temporarily fixing the first region to the second region.

The temporarily fixing means is constituted of four projections (TPH) which are formed in the first region and four cutout portions (KRH) which are formed in the second region. Further, in a state that the portion of the flexible printed circuit board (FPC) which is folded back to the back side of the backlight (BLT) is folded along the imaginary folding line (ORS), the respective projections (TPH) are inserted into the respective cutout portions (KRH) thus temporarily fixing the first region to the second region.

Here, the first region of the flexible printed circuit board (FPC) includes slits (KRJ) each of which is formed along three sides of the second rectangular shape, and each projection (TPH) is constituted of a portion which has one side thereof connected to the flexible printed circuit board (FPC) and has three remaining other sides thereof cut out from the flexible printed circuit board (FPC) by the slit (KRJ) formed in the flexible printed circuit board (FPC) along three sides of the second rectangular shape.

According to this embodiment, it is possible to obtain the following advantageous effects.

Figure 10A:
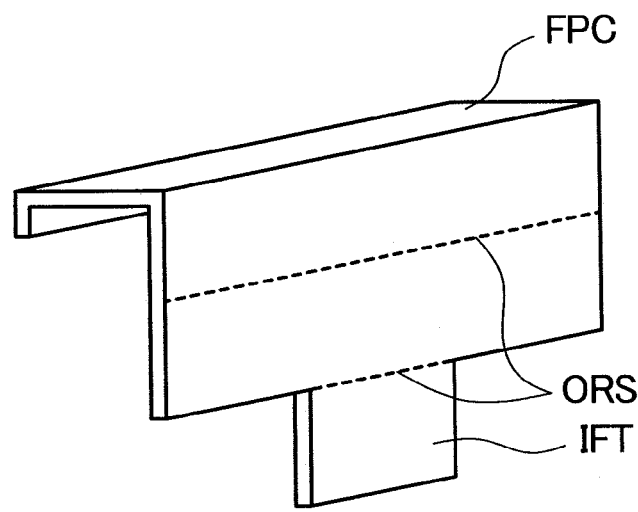
FIG. 10 is a perspective view for explaining the structure which can fold the flexible printed circuit board (FPC) in a compact form by folding the flexible printed circuit board (FPC) plural times in the conventional liquid crystal display module.
Figure 10A:
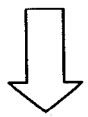
Figure 10B:
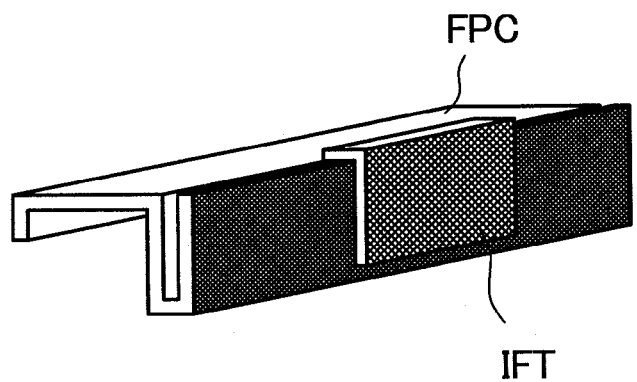

(1) In the conventional liquid crystal display module, as shown in FIG. 10, it has been necessary to fold back the I/F portion (IFT) to the back side of the backlight (BLT) in a final step. However, in this embodiment, it is no more necessary to fold the I/F portion (IFT) and hence, the number of folding times of the flexible printed circuit board (FPC) can be decreased. Accordingly, it is possible to shorten an operation time.

(2) In the conventional liquid crystal display module, the number of times that the I/F portion (IFT) used for connecting the flexible printed circuit board (FPC) and the printed circuit board on which the driver circuits is mounted (DCB) receives a folding force is increased and hence, a possibility that the flexible printed circuit board (FPC) and the printed circuit board on which the driver circuits is mounted (DCB) are disconnected from each other is liable to be increased. However, in this embodiment, the I/F portion (IFT) connected to the printed circuit board on which the driver circuits is mounted (DCB) can be pulled out straightly and hence, a bent portion is not formed in the I/F portion (IFT) whereby it is possible to expect an advantageous effect that the disconnection between the flexible printed circuit board (FPC) and the printed circuit board on which the driver circuits is mounted (DCB) can be prevented.

(3) The larger the number of folding times of the flexible printed circuit board (FPC), a thickness of the flexible printed circuit board (FPC) is increased. However, in this embodiment, by forming the I/F portion (IFT) in the inside of the flexible printed circuit board (FPC), the number of folding times of the flexible printed circuit board (FPC) can be decreased and hence, it is possible to decrease a thickness of a product (a portion indicated by an arrow W in FIG. 2).

(4) As in the case of this embodiment, by adopting the structure which forms the I/F portion (IFT) in the inside of the flexible printed circuit board (FPC), it is possible to increase the number of flexible printed circuit boards (FPC) to be mounted on one mother board in manufacturing the flexible printed circuit boards (FPC) compared to a case which adopts the structure in which the I/F portion (IFT) projects outwardly from one side of the flexible printed circuit board (FPC) as in the case of the conventional flexible printed circuit board (FPC).

Figure 6A:
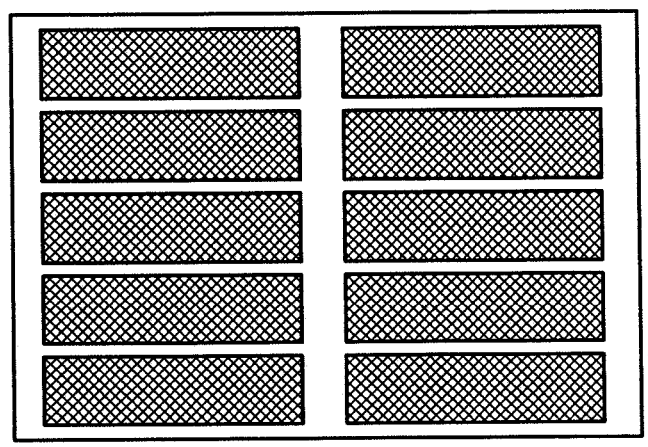
FIG. 6A is a view for explaining the number of flexible printed circuit boards to be mounted on a mother board in manufacturing the flexible printed circuit boards of the embodiment of the present invention.
Figure 6B:
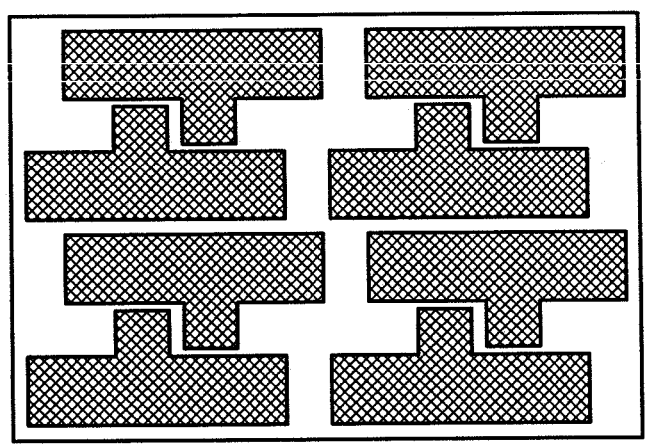
FIG. 6B is a view for explaining the number of flexible printed circuit boards to be mounted on a mother board in manufacturing conventional flexible printed circuit boards.
Figure 7:
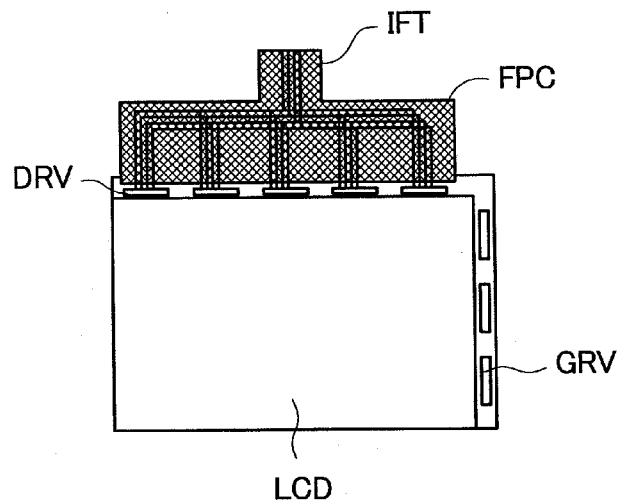
FIG. 7 is a view for explaining the conventional constitution of a vehicle-mounting TFT liquid crystal module such as a car navigation system.
Figure 8A:
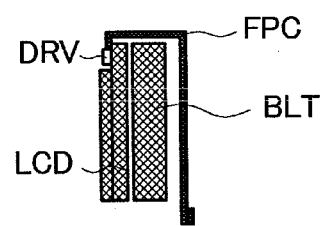
FIG. 8 is a cross-sectional view for explaining the structure which can fold the flexible printed circuit board in a compact form by folding the flexible printed circuit board plural times in a conventional liquid crystal display module.
Figure 8B:
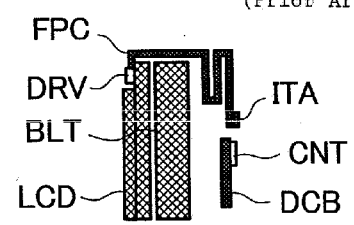
Figure 9A:
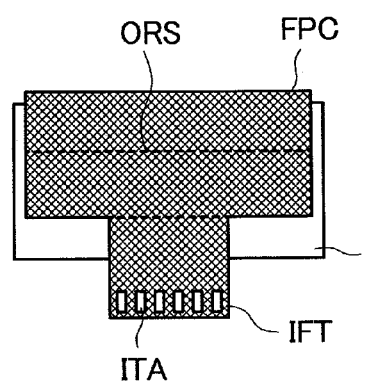
FIG. 9 is a back view for explaining the structure which can fold the flexible printed circuit board (FPC) in a compact form by folding the flexible printed circuit board (FPC) plural times in the conventional liquid crystal display module.
Figure 9B:
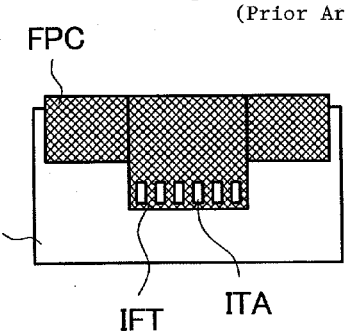

FIG. 6A is a view for explaining the number of flexible printed circuit boards (FPC) to be mounted on one mother board in manufacturing the flexible printed circuit boards (FPC) of this embodiment, and FIG. 6B is a view for explaining the number of flexible printed circuit boards (FPC) to be mounted on one mother board in manufacturing the conventional flexible printed circuit board (FPC).

In FIG. 6A and FIG. 6B, assuming that one mother board of this embodiment and one mother board of the conventional technique have the same size, as shown in FIG. 6A, this embodiment can produce ten pieces of flexible printed circuit boards (FPC), while as shown in FIG. 6B, the conventional technique can produce only eight pieces of flexible printed circuit board (FPC).

Accordingly, this embodiment can increase the number of flexible printed circuit boards (FPC) which can be produced from one mother board thus lowering a manufacturing cost of the flexible printed circuit boards (FPC).

(5) By forming the projections (TPH) and the cutout portions (KRH) in the flexible printed circuit board (FPC) for temporary fixing, a pressure-sensitive adhesive double coated tape for temporarily fixing the flexible printed circuit board (FPC) in a state that the flexible printed circuit board (FPC) is folded becomes unnecessary and hence, it is possible to decrease the number of parts and, at the same time, a time for adhering the pressure sensitive adhesive double coated tape can be saved.

(6) Conventionally, when the flexible printed circuit board (FPC) is shipped without forming the printed circuit board on which the driver circuits is mounted (DCB), it is necessary to temporarily fix the I/F portion (IFT) which is connected to the printed circuit board on which the driver circuits is mounted (DCB) using a tape of the like. However, according to this embodiment, the I/F portion (IFT) which is connected to the printed circuit board on which the driver circuits is mounted (DCB) is pulled out straightly and hence, the tape for temporary fixing becomes unnecessary.

Here, although the explanation has been made heretofore with respect to the embodiment in which the present invention is applied to the liquid crystal display device, the present invention is not limited to the above-mentioned embodiment. For example, the present invention is applicable to a display device such as an organic EL display device in general.

Although the invention made by the inventors of the present invention has been specifically explained in conjunction with the embodiment heretofore, it is needless to say that the present invention is not limited to the above-mentioned embodiments and various modifications are conceivable without departing from the gist of the present invention.

What is claimed is:

1. A display device comprising:
    a display panel which has substrates; and
    a flexible printed circuit board which has one end thereof fixed to a peripheral portion of a first side of the substrate;

wherein
the flexible printed circuit board includes an I/F portion on which a plurality of input terminals is formed;
the I/F portion is, in a state that the flexible printed circuit board is developed, formed in the inside of the flexible printed circuit board;
the flexible printed circuit board forms slits therein along three sides of a predetermined first rectangular shape;
the I/F portion is constituted of a portion which has one side thereof connected to the flexible printed circuit board and has remaining three other sides thereof cut out from the flexible printed circuit board due to the slits formed in the flexible printed circuit board along three sides of the first rectangular shape;
the flexible printed circuit board is folded back to a back side of the display panel, out of a portion of the flexible printed circuit board which is folded back to the back side of the display panel, assuming a part of the portion which includes a distal end portion of the flexible printed circuit board as a first region and assuming a remaining part of the flexible printed circuit board as a second region with an arbitrary imaginary folding line sandwiched therebetween, the portion of the flexible printed circuit board which is folded back to the back side of the display panel is folded back along the arbitrary imaginary folding line such that the first region overlaps the second region;
the I/F portion projects outwardly from the imaginary folding line in a state that the portion of the flexible printed circuit board which is folded back to the back side of the display panel is folded back along the imaginary folding line;
the display device includes a means for temporarily fixing the first region to the second region in a state that the portion of the flexible printed circuit board which is folded back to the back side of the display panel is folded back along the arbitrary imaginary folding line such that the first region overlaps the second region;
the means for temporarily fixing the first region to the second region is constituted of a projection formed on the first region and a cutout portion formed in the second region; and
the first region is temporarily fixed to the second region by inserting the projection into the cutout portion in a state that the portion of the flexible printed circuit board which is folded back to the back side of the display panel is folded back along the arbitrary imaginary folding line.

2. The display device according to claim 1, wherein the I/F portion is connected to the flexible printed circuit board in the first region.

3. The display device according to claim 1, wherein the I/F portion is connected to the flexible printed circuit board in the second region.

4. The display device according to claim 1, wherein the flexible printed circuit board forms a guide groove therein along the imaginary folding line.

5. The display device according to claim 1, wherein the first region of the flexible printed circuit board forms slits therein along three sides of a predetermined second rectangular shape, and
the projection is constituted of a portion which has one side thereof connected to the flexible printed circuit board and has remaining three other sides thereof cut out from the flexible printed circuit board by the slits formed in the flexible printed circuit board along three sides of the second rectangular shape.

6. The display device according to claim 1, wherein the display panel is a liquid crystal display panel, a backlight is mounted on a back side of the liquid crystal display panel, and the flexible printed circuit board is folded back to the back side of the backlight.

* * * * *